(12) United States Patent
AlSinan et al.

(10) Patent No.: US 10,948,439 B2
(45) Date of Patent: Mar. 16, 2021

(54) METHODS AND SYSTEMS FOR MEASURING PORE VOLUME COMPRESSIBILITY WITH LOW FIELD NUCLEAR MAGNETIC RESONANCE TECHNIQUES

(71) Applicant: Saudi Arabian Oil Company, Dhahran (SA)

(72) Inventors: Marwah Mufid AlSinan, Al Qatif (SA); Hyung Tae Kwak, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 28 days.

(21) Appl. No.: 16/534,736

(22) Filed: Aug. 7, 2019

(65) Prior Publication Data
US 2020/0371052 A1 Nov. 26, 2020

Related U.S. Application Data

(60) Provisional application No. 62/850,362, filed on May 20, 2019.

(51) Int. Cl.
*G01N 24/08* (2006.01)
*G01V 3/14* (2006.01)
(Continued)

(52) U.S. Cl.
CPC .......... *G01N 24/081* (2013.01); *G01R 33/44* (2013.01); *G01V 3/14* (2013.01); *G01R 15/08* (2013.01);
(Continued)

(58) Field of Classification Search
CPC ...... G01N 24/081; G01R 15/08; G01R 33/44; G01R 33/24; G01V 3/14; G01V 2210/6246; G01V 2210/6244
See application file for complete search history.

(56) References Cited

U.S. PATENT DOCUMENTS

| 7,352,179 B2 | 4/2008 | Chen et al. | |
| 2019/0317034 A1* | 10/2019 | Kwak | ..................... G01R 33/30 |
| 2019/0369036 A1* | 12/2019 | Kwak | .................. G01N 24/081 |

FOREIGN PATENT DOCUMENTS

| CA | 2524993 | 10/2014 |
| CN | 108226002 | 6/2018 |

OTHER PUBLICATIONS

Biolin Scientific, [online], "Measurements: Contact Angle," retrieved from URL <https://www.biolinscientific.com/measurements/contact-angle>, retrieved on Aug. 15, 2019, available on or before Oct. 2017 via wayback macine URL <https://web.archive.org/web/20171015000000*/https://www.biolinscientific.com/measurements/contact-angle>, 9 pages.

(Continued)

*Primary Examiner* — Susan S Lee
(74) *Attorney, Agent, or Firm* — Fish & Richardson P.C.

(57) ABSTRACT

Systems, methods, and apparatuses for determining pore volume and pore volume compressibility of secondary porosity in rock samples is disclosed. In some implementations, determining a pore volume of a secondary porosity in a rock core sample may include saturating the rock sample with deuterium oxide (D2O) by applying a vacuum to the core sample covered by D2O; centrifuging the saturated rock sample at a selected rotational speed in the presence of a second fluid to displace a portion of the D2O from the rock sample with the second fluid; measuring the rock sample with low-field $^1$H nuclear magnetic resonance (NMR) to determine a volume of the second fluid within the rock sample; and determining a pore volume associated with a secondary porosity based on the volume of the second fluid within the rock sample.

11 Claims, 5 Drawing Sheets

(51) Int. Cl.
  *G01R 33/44* (2006.01)
  *G01R 33/24* (2006.01)
  *G01R 15/08* (2006.01)
(52) U.S. Cl.
  CPC ...... *G01R 33/24* (2013.01); *G01V 2210/6244* (2013.01); *G01V 2210/6246* (2013.01)

(56) References Cited

OTHER PUBLICATIONS

Bisai, "A study on modes of rock failure under uniaxial compression," Master's thesis for Master of Technology in Geotechnical Engineering, Civil Engineering, Department of Civil Engineering National Institute of Technology, May 2014, 53 pages.
Blunt, "Digital Core Analysis and its Application of Reservoir Engineering," course notes, Master of Science in Petroleum Engineering and Petroleum Geophysics, Department of Earth Science and Engineering, Imperial College London and Politecnico di Milano, May 28, 2014, 237 pages.
Brown and Scholz, "Broad bandwidth study of the topography of natural rock surfaces," Journal of Geophysical Research, vol. 90, No. B14, Dec. 10, 1985, 9 pages.
Core Laboratories, [online], "Rock Properties—Advanced Rock Properties—Pore Volume Compressibility, Pore Volume Compressibility: UPVC, HPVC and RTCM," retrieved from URL <www.corelab.com/ps/pore-volume-compressibility>, retrieved on Aug. 15, 2019, available on or before 2019, 5 pages.
Dijk et al., "Investigation of flow in water-saturated rock fractures using nuclear magnetic resonance imaging(NMRI)," Water Resources Research, vol. 35, No. 2, Feb. 1999, 14 pages.
Dudley et al., "Suggested Methods for Uniaxial-Strain Compressibility Testing for Reservoir Geomechanics," Draft to ISRM Comission on Testing, Rock Mechanics and Rock Engineering. vol. 49, Apr. 13, 2015, 29 pages.
Engineering Solutions Equipment, [online], "Triaxial cell," retrieved from URL <https://www.indiamart com/engineering-solutions-equipment/triaxial-cells.html> retrieved on Aug. 15, 2019, available on or before Jan. 30, 2019, 2 pages.
Gentier and Hopkins, "Mapping fracture aperture as a function of normal stress using a combination of casting, image analysis and modeling techniques," Int J Rock Mech Min Sci, vol. 34, No. 3-4, Paper No. 132, 1997, 14 pages.
Green Image Technologies Inc., "GIT Systems and LithoMetrix User Manual," Revision 1.9, Jan. 22, 2016, 179 pages.
Green Imaging Technologies, "NMR and Core Analysis Technical Datasheet," GIT inc., Oxford Instruments, 2015, 8 pages.
Hagoort, "Oil Recovery by Gravity Drainage," Society of Petroleum Engineers Journal, Jun. 1980, 12 pages.
Hakami and Larsson, "Aperture measurements and flow experiments on a single natural fracture," Int J Rock Mech Min Sci Geomech Abstracts, vol. 33, No. 4, 1996, 10 pages.
Hassler and Brunner, "Measurement of capillary pressures in small core samples," Transactions of the AIME 160.01, Los Angeles Meeting, Oct. 1944, 10 pages.

Karimi et al., "Reservoir Rock Characterization Using Centrifuge and Nuclear Magnetic Resonance: A Laboratory Study of Middle Bakken Cores," SPE Annual Technical Conference and Exhibition, Houston, Texas, Sep. 28-30, 2015, 19 pages.
Keller, "High resolution, non-destructive measurement and characterization of fracture apertures," Int J Rock Mech Min Sci, col. 35 No. 8, 1998, 14 pages.
Perm inc, [online], "Chapter 2: Multi-phase saturated rock properties: Laboratory Measurement of Capillary Pressure: Centrifugal Method," retrieved from URL <www.perminc.com/resources/fundamentals-of-fluid-flow-in-porous-media/chapter-2-the-porous-medium/multi-phase-saturated-rock-properties/laboratory-measurement-capillary-pressure/centrifugal-method/>, retrieved on Aug. 15, 2019, available on or before Oct. 2015 via wayback machine URL <https://web.archive.org/web/20150915000000*/http://perminc.com/resources/fundamentals-of-fluid-flow-in-porous-media/chapter-2-the-porous-medium/multi-phase-saturated-rock-properties/laboratory-measurement-capillary-pressure/centrifugal-method/>, 4 pages.
Ruth, "Analysis of Centrifuge Relative Permeability Data," University of Manitoba, 1997, 10 pages.
Sharifzadeh et al., "Rock joint surfaces measurement and analysis of aperture distribution under different normal and shear loading using GIS," Rock Mechanics and Rock Engineering, Apr. 2008, 38 pages.
Straley et al., "Low-field NMR Profiles for Verification of Oil and Water Saturation in Cores," presented at the International Symposium of the Society of Core Analysts, Trodheim, Norway, Sep. 12-16, 2006, 12 pages.
The Constructor: Civil Engineering Home, [online], "Laboratory Tests for determining strength of rocks," retrieved from URL <https://theconstructor.org/building/laboratory-tests-determine-strength-rocks/11665/>, retrieved on Aug. 15, 2019, available on or before 2019, 4 pages.
Vinci Technologies, "Determination of Capillary pressure and relative permeability curves, with refrigerated centrifuge," retrieved from URL <https://www.vinci-technologies.com/images/contenu/documents/application-note-Centrifuge-RC4500.pdf>, retrieved on Aug. 15, 2019, available on or before Feb. 2019, 6 pages.
wikipedia.org, [online], "Heavy Water," retrieved from URL <https://en.wikipedia.org/wild/Heavy_water>, retrieved on Aug. 15, 2019, available on or before Jan. 2004, 9 pages.
Gomes et al., "Reservoir rock typing using NMR & Centrifuge," presented at the International Symposium of the Society of Core Analysts, Avignon, France, Sep. 8-11, 2014, 6 pages.
Iwere et al., "Vug characterization and pore volume compressibility for numerical simulation of vuggy and fractured carbonate reservoirs," SPE 74341, presented at the SPE International Petroleum Conference and Exhibition, Villahermosa, Mexico, Feb. 10-12, 2002, 9 pages.
Mai et al., "Porosity Distributions in Carbonate Reservoirs Using Low-Field NMR," Journal of Canadian Petroleum Technology, Jul. 2007, 46(7):30-37.
PCT International Search Report and Written Opinion in International Appln. No. PCT/US2020/033549, dated Aug. 20, 2020, 30 pages.

* cited by examiner

METHODS AND SYSTEMS FOR MEASURING PORE VOLUME COMPRESSIBILITY WITH LOW FIELD NUCLEAR MAGNETIC RESONANCE TECHNIQUES

CROSS-REFERENCE TO RELATED PATENT APPLICATIONS

This application claims the benefit of priority to U.S. Provisional Application No. 62/850,362, filed May 20, 2019, the contents of which are incorporated by reference herein.

TECHNICAL FIELD

The present disclosure relates to measurement of pore volume compressibility of secondary porosities within porous materials.

BACKGROUND

Pore volume compressibility can be measured using different tests such as uniaxial strain compressibility (USC) testing using pore pressure depletion (PPD) or constant pore pressure (CPP) protocols and hydrostatic pore volume compressibility tests. These methods are effective for homogenous and isotropic samples but provide reduced accuracy in inhomogeneous, fractured, and vuggy rocks.

SUMMARY

A first aspect of the present disclosure is directed to a method for determining secondary porosities in a rock sample. The method may include saturating a rock sample with deuterium oxide ($D_2O$); centrifuging the rock sample at a first selected rotational speed in the presence of a second fluid to displace a portion of the $D_2O$ in the rock sample with the second fluid; measuring the rock sample with low-field $^1H$ nuclear magnetic resonance (NMR) to determine a first volume of the second fluid within the rock sample; and determining a pore volume associated with a secondary porosity based on the first volume of the second fluid within the rock sample.

A second aspect of the present disclosure is directed to an apparatus for determining porosities in a rock sample. The apparatus may include one or more processors and a non-transitory computer-readable storage medium coupled to the one or more processors and storing programming instructions for execution by the one or more processors. The programming instructions may instruct the one or more processors to: saturate a rock sample with deuterium oxide ($D_2O$); centrifuge the rock sample at a first selected rotational speed in the presence of a second fluid to displace a portion of the $D_2O$ in the rock sample with the second fluid; measure the rock sample with low-field $^1H$ nuclear magnetic resonance (NMR) to determine a volume of the second fluid within the rock sample; and determine a pore volume associated with a secondary porosity based on the volume of the second fluid within the rock sample.

A third aspect of the present disclosure is directed to a computer program product encoded on a non-transitory medium. The computer program product may include computer readable instructions for causing one or more processors to perform operations including: saturating a rock sample with deuterium oxide ($D_2O$); centrifuging the rock sample at a first selected rotational speed in the presence of a second fluid to displace the $D_2O$ in the rock sample with the second fluid; measuring the rock sample with low-field $^1H$ nuclear magnetic resonance (NMR) to determine a volume of the second fluid within the rock sample; and determining a pore volume associated with a secondary porosity based on the volume of the second fluid within the rock sample.

The various aspects may include one or more of the following features. Saturating the rock sample with $D_2O$ may include saturating the rock sample with a solution containing $D_2O$. Saturating the rock sample with $D_2O$ may include saturating the rock sample with a vacuum pump or pressure cell. A selected confining stress may be applied to the rock sample while centrifuging the rock sample. The selected confining stress may be an in situ confining stress of a reservoir from which the rock sample was obtained. A selected temperature may be applied to the rock sample while centrifuging the rock sample. The selected temperature may be an in situ temperature of a reservoir from which the rock sample was obtained. The rock sample may be centrifuged in the presence of the second fluid at a second selected rotational speed greater than the first selected rotational speed after the measuring the rock sample with low-field $^1H$ NMR. The rock sample may be measured with low-field $^1H$ NMR following centrifuging of the rock sample at the second selected rotational speed to determine a second volume of the second fluid in the rock sample. A volume of $D_2O$ displaced from the rock sample by the second fluid during centrifuging the rock sample at the second selected rotational speed may be allocated based on the first volume of the second fluid and second volume of the second fluid. The pore volume associated with a secondary porosity may include a pore volume associated with a first secondary porosity. Allocating a volume of $D_2O$ displaced from the rock sample by the second fluid during centrifuging the rock sample as the second selected rotational speed based on the first volume of the second fluid and second volume of the second fluid may include determining a pore volume associated with a second secondary porosity. Allocating a volume of $D_2O$ displaced from the rock sample by the second fluid during centrifuging the rock sample as the second selected rotational speed may include determining a compressibility of the pore volume associated with the secondary porosity. The low-field $^1H$ NMR may be a $^1H$ NMR $T_2$ measurement.

The various aspects may include one or more of the following features. Programming instructions operable to cause the one or more processors to saturate a rock sample with $D_2O$ comprise programming instructions may be operable to cause the one or more processors to operate a vacuum pump or a pressure cell to generate a pressure drop across the rock sample. The programming instructions operable to cause the one or more processor to centrifuge the rock sample at a first selected rotational speed may include computer program instructions operable to controlling a centrifuge to rotate the rock sample at the first selected rotational speed to displace a portion of the $D_2O$ with the second fluid. Programming instructions may be operable to cause the one or more processors to apply a confining pressure to the rock sample during centrifuging of the rock sample at the first rotational speed. The programming instructions operable to cause the one or more processors to measure the rock sample with low-field $^1H$ NMR to determine the volume of the second fluid within the rock sample may include programming instructions operable to cause the one or more processors to measure the rock sample with a low-field $^1H$ NMR $T_2$ measurement. Saturating a rock sample with $D_2O$ may include operating a vacuum pump or pressure cell to generate a pressure drop across the rock sample. Centrifuging the rock sample at a first selected rotational speed in the presence of a second fluid to displace the $D_2O$ in the rock sample with the second fluid may include controlling a centrifuge to rotate the rock sample at the first selected rotational speed to displace a portion of the $D_2O$ with the second fluid. Measuring the rock sample with low-field $^1H$ NMR to determine a volume of the second fluid within the rock sample may include measuring the rock sample with a low-field $^1H$ NMR $T_2$ measurement.

The details of one or more implementations of the present disclosure are set forth in the accompanying drawings and the description to follow. Other features, objects, and advantages of the present disclosure will be apparent from the description and drawings, and from the claims.

DETAILED DESCRIPTION

For the purposes of promoting an understanding of the principles of the present disclosure, reference will now be made to the implementations illustrated in the drawings, and specific language will be used to describe the same. Nevertheless, no limitation of the scope of the disclosure is intended. Any alterations and further modifications to the described devices, systems, methods, and any further application of the principles of the present disclosure are fully contemplated as would normally occur to one skilled in the art to which the disclosure relates. In particular, it is fully contemplated that the features, components, steps, or a combination of such described with respect to one implementation may be combined with the features, components, steps, or a combination of such described with respect to other implementations of the present disclosure.

The present disclosure is directed to methods, systems, and apparatuses for determining pore volume compressibility in different secondary porosities within porous materials and, particularly, pore volume compressibility of different secondary porosities in naturally fractured reservoir rock using nuclear magnetic resonance (NMR) techniques.

Pore volume of secondary porosity, such as fractures and vuggs, in naturally fractured reservoirs influence the permeability and flow capacity of fluids through the reservoir rock. Pore volume and secondary porosity affect recovery, such as a production rate and total reserve of the reservoir. Additionally, changes in-situ conditions (such as stress, thermal expansion, and pore pressure) alter the pore volume of these heterogeneities. Thus, developing an accurate correlation for the fracture pore volume with different factors is important for accurate characterization of reservoirs with multiple types of secondary porosities. These correlations are input to geological and simulation models used to predict recovery of oil and gas reservoirs. Therefore, accurately characterizing secondary porosity pore volume in multi-porosity geophysical models, such as dual-porosity single permeability (DPSK) models and discrete fracture network models, is important. Also, since recovery is more challenging in heterogeneous fractured reservoirs, developing a correlation between the fracture pore volume compressibility and different in-situ conditions is important for enhanced oil recovery (EOR) operations and improved oil recovery (IOR) operations. In addition, estimating the fracture pore volume in a thief zone is important for the success of secondary or tertiary recovery diversion applications, such as secondary or tertiary diversion applications involving gels and polymers.

The pore volume of fractures and similar heterogeneities can change under different circumstances. For example, in-situ stress, thermal expansion, and pore pressure, can affect the pore volume of fractures and similar heterogeneities, which can confound development of a correlation between pore volume compressibility and different reservoir conditions. Therefore, the compressibility of the pore volume of a fracture can be measured in the lab, where conditions, such as temperature, confinement, shear forces, and pore pressures, can be controlled. These controlled experiments can be used to develop a correlation between the pore volume and the applied conditions. These correlations may be supplied to a reservoir simulation model to provide a better approximation of the physical reality.

Conventionally, pore volume compressibility is measured using different tests, such as uniaxial strain compressibility (USC) testing using pore pressure depletion (PPD); constant pore pressure (CPP) protocols; and hydrostatic pore volume compressibility testing. While these methods have success for determining a change in pore volume in homogenous and isotopic rock samples, these methods have diminished accuracy in the context of inhomogeneous, fractured, and vuggy rocks. This diminished accuracy results from the inability of these methods to apply different compressibilities to different secondary porosities in a sample. Further, more than one fracture plane can develop in the sample during fracturing in a triaxial cell, and these different fracture planes are not necessarily predictable. These deficiencies also arise in the case of unconsolidated rocks, where the samples are usually heavily fractured. As a result, conventional approaches are undesirable and produce largely unsatisfactory results in the context of inhomogeneous, fractured, and vuggy rocks.

Other conventional pore volume compressibility measurement approaches, such as fluorescent epoxy injection into joints, image analysis of fracture casts, and surface profilometer methods, are also deficient. For example, these approaches are destructive in that samples are destroyed during testing, have poor accuracy and repeatability, take measurements at room temperature as opposed to in situ conditions, have poor resolution, require multiple experiments, and require considerable time to complete (for example, weeks are needed to complete testing). Still further, other conventional non-destructive testing are also lacking. X-Ray Chromatographic Imaging and Magnetic Resonance Imaging (MRI) are imaging techniques and, therefore, suffer from poor spatial resolution associated with voxel size.

Figure 1:
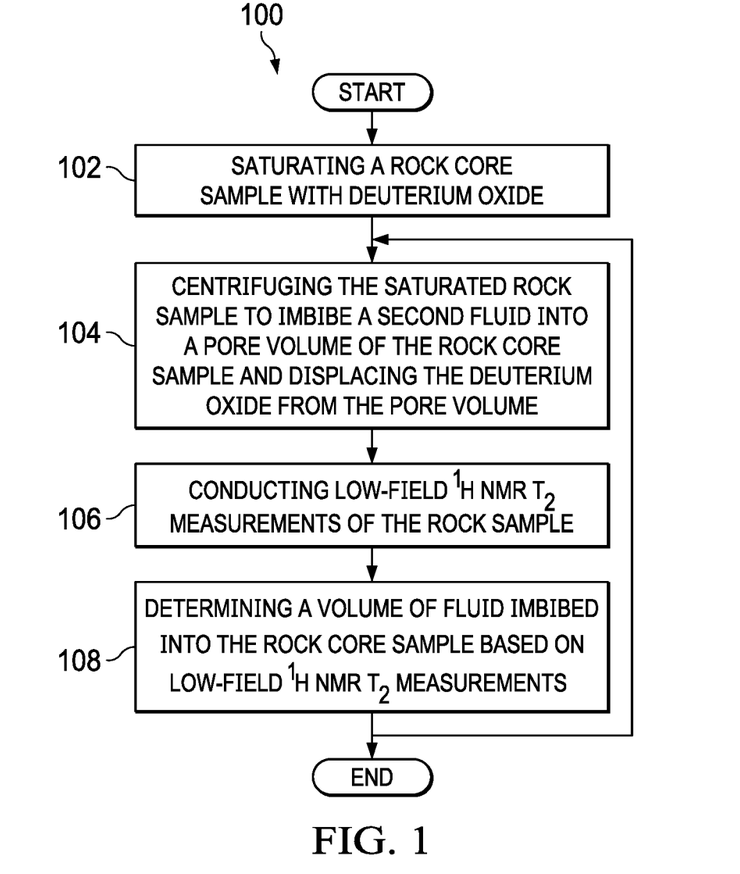
FIG. 1 is a flowchart of an example method of measuring pore volume compressibility in secondary porosities, according to some implementations of the present disclosure.

The systems, methods, and apparatuses of the present disclosure avoid these drawbacks from current approaches. FIG. 1 is a flowchart of an example method 100 of measuring pore volume compressibility in secondary porosities. At 102, a rock sample, such as in the form of a core sample, of a rock type under consideration (such as an inhomogeneous, fractured, or vuggy rock) is imbibed and saturated with deuterium oxide or heavy water (also referred to a $^2H_2O$ or $D_2O$). In some implementations, the core sample may be in the form of a core plug. $D_2O$ is used to saturate the sample because $D_2O$ is not detected by (or is "invisible" to) $^1H$ or Proton nuclear magnetic resonance imaging (NMR). The core sample may be saturated with $D_2O$ with the use of vacuum pressure. In some instances, the core sample may is placed in a container, and $D_2O$ is added to the container until the core sample is covered by the $D_2O$. The core sample and $D_2O$ covering the core sample are placed in a core saturator, such as the core saturator 202 of a saturation unit 200 shown in FIG. 2.

Figure 2:
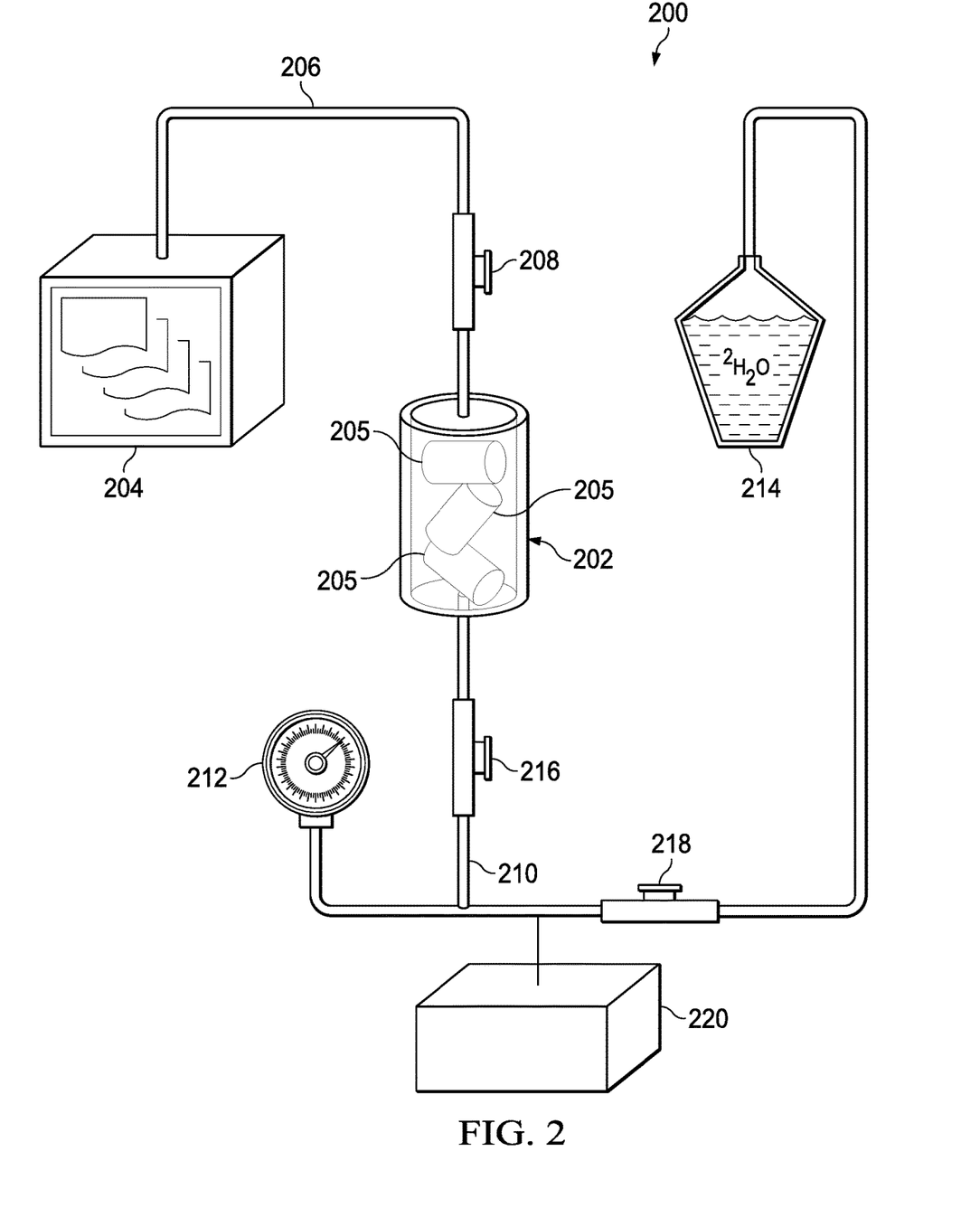
FIG. 2 is an example saturation unit used to saturate a core sample with $D_2O$ or a solution containing $D_2O$, according to some implementations of the present disclosure.

As shown in FIG. 2, the saturation unit 200 also includes a vacuum pump 204 in fluid communication with the core saturator 202 via a line 206. A first isolation valve 208 is disposed in the line between the vacuum pump 204 and the core saturator 202. The first isolation valve 208 is operable to selectively isolate the core saturator 202 from the vacuum pump 204. A line 210 also extends from the core saturator 202. A pressure gauge 212 is in fluid communication with the core saturator 202 via the line 210. A container 214 is also in fluid communication with line 210. The container 214 contains a volume of $D_2O$. The $D_2O$ is used to saturate the pore volume contained within the one or more core samples (identified as 205) contained in the core saturator 202 FIG. 2. A second isolation valve 216 and a third isolation valve 218 are also disposed in line 210. The second isolation valve 216 is operable to selectively isolate the core saturator 202 from the pressure gauge 212 and the container 214. The third isolation valve 218 is operable to selectively isolate the core saturator 202 from the container 214. The saturation unit 200 also includes a controller 220. The controller 220 is used to control the vacuum pump 204 to produce a selected pressure within the core saturator 202. In some instances, the controller 220 may receive an input from the pressure gauge 212 that is used to control the vacuum pump 204. Further, in some implementations, the controller 220 may be operable to control an open and closed configuration of each of the isolation valves 208, 216, and 218.

The saturation unit 200 performs vacuum saturation by replacing air or other gases (collectively referred to as "air") from pores within the core sample 205 with $D_2O$. With the core sample 205 disposed in the core saturator 202, the core saturator 202 is sealed, and the vacuum pump 204 operates to extract air contained in the core sample 205. As the air is withdrawn from the pores contained within the core sample 205, $D_2O$ is imbibed into the pores of the core sample 205 to replace the excised air.

As vacuum pressure is maintained, more and more air is removed from the pores and replaced with $D_2O$ until a saturation point is reached where, effectively, additional air cannot be removed from the pores. This is particularly the case for reduced permeability samples. An amount of time needed to saturate the core sample 205 with $D_2O$ may vary. For example, the saturation time may vary depending on the porosity and permeability of the core sample. For some core samples, a period of eight to ten hours may be a sufficient amount of time to saturate all the pores in the core sample. In other instances, a time period in excess of eight to ten hours may be needed to saturate the pores within the core sample. Where subsequent testing may not occur immediately, the plug core saturated with $D_2O$ may be encapsulated in order to preserve the fluids inside of the core sample. For example, the saturated core sample may be wrapped in plastic or polytetrafluoroethylene tape or encapsulated in wax or paraffin.

In some instances, a pressure cell may be used to saturate core samples having a pore structure that is particularly challenging to imbibe. The working principle for a pressure cell is similar to that for the saturation unit 200, described earlier. A pressure cell differs from a saturation unit in that the pressure cell is capable of applying a pressure drop across the core sample that is greater than a pressure drop that could be provided by a vacuum pump. This greater pressure drop operates to overcome capillary pressures (that is, entry pressure) of the pores in the core sample that may not be possible with a vacuum pump. Additionally, for vacuum saturation, a maximum pressure drop across the core sample provided by a vacuum pump may be 14.7 pounds per square inch (psi) (ambient pressure (14.7 psi)-vacuum (0 psi)). Whereas, a pressure cell injects fluid at a pressure greater than ambient pressure, such as 14.7 psi. A maximum pressure applied by a pressure cell may depend on the capability of an injection pump of the pressure cell.

In some implementations, additives, such as salts, may be added to the $D_2O$ to form non-reactive brines used to imbibe core samples. Whether any additives are added to the $D_2O$ for imbibing into a sample may depend on the composition of the core sample. For example, if a core sample contains clays or anhydrite, then salts, such as KCl, may be added to the $D_2O$ to form a brine. The KCl-$D_2O$ brine solution avoids clay swelling or anhydrite dissolution in the core sample. If $D_2O$ were used without the KCl, the resulting clay swelling or anhydrite dissolution would alter the original porosity distribution in the core sample.

Another consideration that may be taken into account when saturating a core sample is the temperature at which the saturation occurs. Nuclear magnetic resonance (NMR) measurements are used to detect changes in pore volume compressibility are temperature sensitive. More particularly, $T_2$ NMR measurements are used to detect changes in pore volume compressibility and are discussed in more detail later. Therefore, to enhance sensitivity of the NMR measurements, the $D_2O$ or $D_2O$ solution (referred to collectively as "$D_2O$") may be maintained at a temperature that matches a temperature of an NMR relaxometer magnet. In some implementations, a temperature of the NMR relaxometer magnet may be within a range of 35° C. to 38° C. (95° F. to 100.4° F.). Therefore, the temperature of the $D_2O$ may be increased to a corresponding temperature in order to produce more sensitive NMR measurements than those where the temperatures do not correspond. However, while corresponding temperature may heighten measurement sensitivity, $T_2$ NMR measurement sensitivity does not vary widely when the temperatures of the relaxometer magnet and the $D_2O$ do not match as compared to other measurement techniques, such as molecular self-diffusion. Consequently, in some implementations, a temperature of the $D_2O$ when saturating a core sample may be at ambient temperature, and the sensitivity of a resulting $T_2$ NMR measurement would remain useful.

Rotational speeds at which a core sample is centrifuged, particularly an initial rotational speed applied to a core sample, may vary depending upon the properties of the rock forming the core sample. For example, properties, such as permeability, porosity, interfacial tension, contact angle, and capillary pressure, of a core sample may affect the rotational speed applied during centrifuging. Thus, as one or more of these properties varies from one core sample to another, the rotational speed applied to a first core sample may be different than a rotational speed applied to another core sample having one or more properties that vary from the first core sample. As an example, if a first sample had a first permeability that was less than a permeability of a second sample, a rotational speed of the first sample would be greater than that of the second sample, and, in some cases, a period of time during which the first sample is spun would be greater than that of the second sample in order for both samples to reach a common level of saturation.

Referring again to FIG. 1, the saturated core sample, such as in the form of a core plug, is centrifuged at 104. Any encapsulation of the core sample to retain imbibed fluids is removed prior to centrifuging. The core sample is removed from a saturation unit used to saturate the core sample and is loaded into a centrifuge. The centrifuge is then rotated at a selected rotational speed, which corresponds to a particular capillary pressure, to displace the $D_2O$ with another fluid that is detectable using NMR techniques, as explained in more detail later. In some implementations, a duration of centrifuging is determined by a rate at which $D_2O$ is displaced from the core sample. For example, an amount of $D_2O$ being removed from the core sample over time may be monitored. A camera may be used to monitor this rate of $D_2O$ removal. When a total volume of $D_2O$ discharged from the core sample is no longer changing with time, the centrifuge may be stopped. In some implementations, a core sample may be centrifuged at a selected rotational speed for a predetermined period of time, such as a number of hours. For example, a core sample may be centrifuged at a selected rotational speed for four hours, five hours, or six hours. Other time periods greater than six hours or less than four hours are within the scope of the present disclosure. The time period during which a core sample is centrifuged may be selected to ensure the total volume of $D_2O$ discharged from the core sample is not changing with time by the end of the predetermined time period of centrifuging. In some implementations, a weight of the core sample may be weighed before and after centrifuging. The measured difference in weight corresponds to the weight of $D_2O$ removed, which can be converted into a volume using the density of $D_2O$. In still other implementations, a centrifuging duration may be determined using known methods, such as solving fractional flow equations using the Buckley-Leverett analytical solution.

Generally, the rotational speed for a particular test is kept constant. Otherwise, increasing the rotational speed while centrifuging but before measuring with the NMR techniques would prevent the collection of useful information associated with the lower rotational speed.

Figure 3:
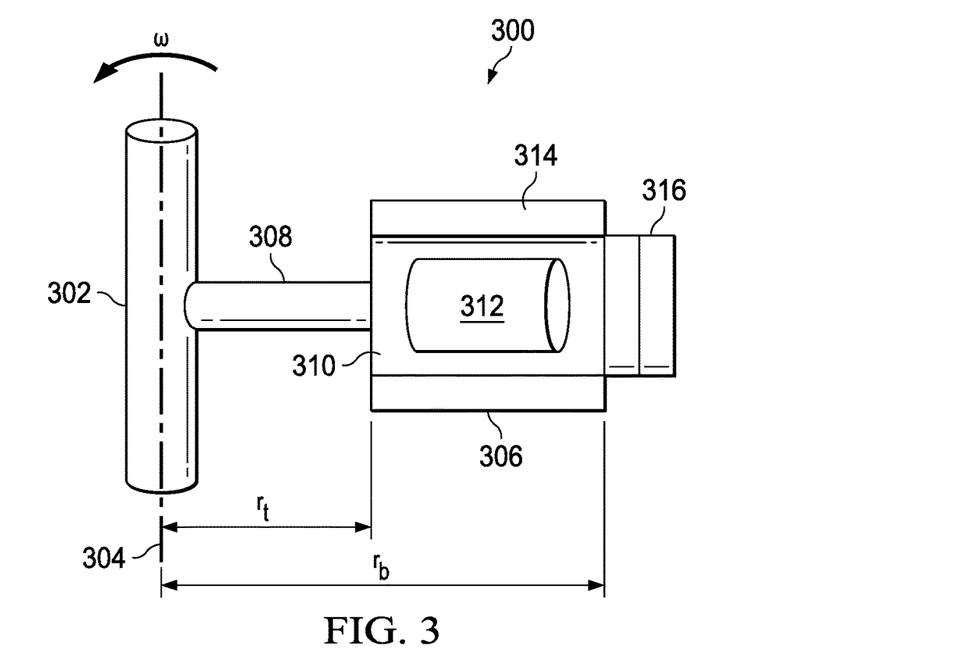
FIG. 3 is a schematic view of an example centrifuge for centrifuging a saturated core sample, according to some implementations of the present disclosure.

FIG. 3 is a schematic view of an example centrifuge 300 that may be used to centrifuge the saturated rock sample. The centrifuge 300 includes a shaft 302 rotatable about a rotation axis 304. A sample holder 306 is attached to the shaft 302 via an arm 308. The sample holder 306 includes a central cavity 310 into which a sample, such as core sample 312, is placed. The central cavity 310 also holds a fluid used to displace the $D_2O$ from the core sample 312 during centrifuging. The core sample 312 is saturated with $D_2O$ and corresponds to the core sample 205 discussed earlier. The sample holder 306 includes an annular space 314 used to apply a confining pressure to the core sample 312 and a collector 316 used to collect $D_2O$ displaced from the core sample 312 during centrifuging. In some implementations, a capillary pressure refrigerated centrifuge RC4500 produced by Vinci Technologies SA of 27 B, rue du Port, 92022, Nanterre, France, may be used.

The Young-Laplace equation describes the capillary pressure difference sustained across an interface between two static fluids. Capillary pressure is inversely proportional to a radius of a pore according to the Young-Laplace equation. Generally, pore sizes of secondary porosity of a rock are larger than the pore sizes of the primary porosity of the rock. As a result, the capillary entry pressure needed to imbibe the larger secondary porosities is lower than the capillary entry pressure needed to imbibe a smaller primary porosity. The Young-Laplace equation describes the capillary pressure needed to imbibe a pore of known radius. The Young-Laplace equation, identified as Equation 1, is as follows:

$$P_c = \frac{2\,\gamma\,\cos\theta}{r_c}, \qquad \text{Equation 1}$$

where $P_c$ is capillary pressure, $\gamma$ is the interfacial tension, $\theta$ is the contact angle, and $r_c$ is the pore radius. $\gamma$ is the interfacial tension between the fluid used initially to saturate a core sample, such as $D_2O$, and a second fluid used to imbibe the core sample to displace the $D_2O$ during centrifuging. The second fluid may be $^1H2O$ or another fluid containing $^1H_2O$, such as oil. In some implementations, the second fluid may be a fluid that is present within the formation from where the rock sample was obtained.

The rotational speed of a centrifuge is proportional to capillary pressure. Therefore, a rotational speed of the centrifuge may be selected to imbibe a pores having a particular capillary pressure. In some implementations, the rotational speed of the centrifuge may be iteratively increased in steps in order to determine pore sizes of different secondary porosities present in a rock sample. Thereafter, additional centrifuge runs may be performed to determine pore volume compressibility after an initial baseline determination is made. The capillary pressure corresponding with a specific rotational speed is calculated using the following Equation 2:

$$P_c = 7.9e^{-8} \times (\rho_1 - \rho_2) \times \omega^2 \times (r_b^2 - r_t^2), \qquad \text{Equation 2}$$

where $\rho_1$ is a density of a fluid initially saturating a core sample (such as $D_2O$), $\rho_2$ is the density of a fluid used to displace the liquid initially saturating the core sample from the pores in the core sample, $r_b$ is the radius of rotation of the bottom of a core sample, $r_t$=radius of rotation of the top of the core sample, and $\omega$ is the rotational speed of the centrifuge. $r_b$ and $r_t$ are shown in FIG. 3.

Normal water or $^1H_2O$ is detectable in a rock sample using low-field $^1H$ NMR $T_2$ measurements, and, as mentioned earlier, $D_2O$ is not detectable using low-field $^1H$ NMR. Thus, after centrifuging, low-field $^1H$ NMR is used to detect $^1H_2O$ in the secondary porosities while the $D_2O$ remains invisible or undetected to the $T_2$ NMR measurements. As a result, a pore volume filled by the imbibed fluid $^1H_2O$ caused by a capillary pressure associated with the rotational speed of the centrifuge is determinable. These $^1H$ NMR $T_2$ measurements may be repeated after completion of each rotation of the core sample at a particular rotational speed in the centrifuge. Thus, as the rotational speeds are increased, a user is able to detect an amount of increase of $^1H_2O$ in a core sample associated with a rotational speed and relate the change in $^1H_2O$ back to a pore size. As the rotational speed increases, secondary porosities having increasingly reduced sizes are imbibed by the $^1H_2O$. These changes in the imbibed volume of $^1H_2O$ in the core sample are detectable with the low-field $^1H$ NMR $T_2$ measurements. As a result, multiple secondary porosities are detectable in a core sample along with the pore sizes associated with the different secondary porosities.

Fluids other than $^1H_2O$ may be used to imbibe core samples. Fluids such as those present in a formation from which the core sample was obtained may also be used. For example, oil and materials injected into a well during enhanced oil recovery (EOR) and improved oil recovery (IOR) operations, such as polymers, surfactants, and oxidizers, may also be used. Thus, the type of fluid used to imbibe a core sample during centrifuging may depend on an objective of the testing. For example, if an objective of core volume compressibility testing is to obtain a fracture volume at different stress conditions with no wettability effect, then $^1H_2O$ may be used as the imbibing fluid. Alternatively, in-situ fluids may be used as the imbibing fluid during centrifuging. For example, in-situ fluids, whether naturally occurring or artificially introduced, may be used as the imbibing fluid during centrifuging when understanding fracture volume at different in-situ conditions (such as at different stresses and temperatures) with in-situ fluids (such as oil, water, EOR agents, and IOR agents) is desired. The in-situ fluids may be heated to formation temperatures and pressures during centrifuging.

In addition to the use of different fluid to imbibe a core sample, other factors such as fluid saturation, temperature, and pressure may be varied during centrifuging the core samples. Varying the different factors during centrifuging allows for the development of a correlation between fracture pore volume compressibility and existing in situ conditions. These correlations may be particularly useful in the context of IOR and EOR operations.

As mentioned, pressure applied to core samples may also be altered during centrifuging. For example, confining pressure may also be applied to the core sample during centrifuging. For the example sample holder 306 shown in FIG. 3, confinement pressure is applied to the core sample 312 by hydraulic pressure applied to the annular space 314 formed in the sample holder 306. The applied hydraulic pressure may be controlled with a pump. The pressure applied to the core sample 312 via the annular space may correspond to confining pressure experienced by the formation from which the core sample was obtained. However, a pressure selected for the confining pressure may be any desired pressure. Similarly, a temperature applied to the core sample 312 during centrifuging may also be varied. For example, a temperature applied to the core sample 312 during centrifuging may be a temperature experienced by the formation from which the core sample was obtained. However, other temperatures may also be used.

In some instances, a confining stress applied to a core sample may be increased while a rotational speed of the centrifuge is kept constant. In such instances, a change in pore volume corresponds to vugg compressibility. In other instances, a rotational speed of the centrifuge may be increased while the confining stress is kept constant. In these cases, a change in pore volume corresponds to invasion of the imbibing fluid of smaller fractures. Variations in testing such as these simulate predicted changes to in situ conditions of a reservoir over time as the reservoir is produced. As a result, changes in pore volume compressibility may be predicted based on the changing in situ conditions. Similarly, other experiments in which temperature is varied may be performed in order to predict changes in pore volume compressibility in response to predicted temperature changes in the reservoir over time.

In some instances, initial and incrementally increasing rotational speeds may be arbitrarily selected in order to detect and measure pore volumes of different secondary porosities present in a core sample. In other implementations, the existence, number, and characteristics of fractures included in a core sample may be estimated. With these estimates related to the fractures, a pore volume distribution of the core sample may be qualitatively and quantitatively estimated at ambient conditions (that is, at room condition without any confining stress). This pore volume distribution may be determined, for example, by visual inspection, X-ray micro-CT imaging, Spatial $T_2$ imaging, and NMR imaging. The estimated pore volume distribution assists in determining rotational speeds needed to deplete or imbibe identified pore types.

In still other implementations, a rotational speed for each different pore volume may be calculated using a GIT-CAP Centrifuge Speed Estimator of LithoMatrix software produced by Green Imaging Technologies, Inc., of 520 Brookside Drive, Suite B., Fredericton, NB, Canada, E3A 8V2.

In some implementations, after centrifuging of a core sample at a selected rotational speed is completed, the core sample is removed from the centrifuge, inverted, and returned to the centrifuge. Thereafter, the core sample is spun at the same selected rotational speed as previously applied to the core sample. Performing a centrifuging cycle in this manner normalizes or evens out end effects of a saturation profile in the core sample.

Returning to FIG. 1, at 106, low-field $^1H$ NMR $T_2$ measurements are performed on the centrifuged rock core sample. A peak amplitude of an echo acquired during NMR testing decays away with a time constant $T_2$. For rocks that have multiple decay constants, the peak amplitude decay is governed by the following Equation 3:

$$S(t) = \sum_{i=1}^{N} A(i) e^{-\frac{t}{T_2(i)}}, \qquad \text{Equation 3}$$

where N is the number of $T_2$ relaxation values and A(i) is the amplitude of each relaxation value $T_2(i)$. For rocks, the $T_2$ is related to pore size through the following relationship of Equation 4.

$$\frac{1}{T_2} = \frac{1}{T_{2\text{-}Bulk}} + \rho \frac{S}{V} + (\gamma G T_E)^2 \frac{D_0}{12}, \qquad \text{Equation 4}$$

where $T_2$-Bulk is the $T_2$ of the fluid outside the pore (that is, in bulk). $T_2$-Bulk is usually large compared with the $T_2$ in the pore and thus ignored. The third term is the diffusion term, and, where the echo time, $T_E$, is small, this third term can be ignored. The surface, S, to volume, V, ratio is the pore size, and, if the other terms are ignored, the pore size is directly related to the $T_2$ through the relaxivity parameter, $\rho$.

As mentioned earlier, the $T_2$ NMR measurements do not detect $D_2O$. Therefore, a volume of the $^1H_2O$ that imbibes into and displaces $D_2O$ during centrifuging is measurable. Further, a pore size associated with the volume of $^1H_2O$ imbibed is also determinable, as explained earlier. Thus, at 108, a pore volume is determined for the $T_2$ NMR measurements. Where one or more previous centrifuging operations have occurred, determining a pore volume from the latest centrifuging operation is obtained by subtracting the previously determined cumulative pore volume from the pore volume obtained from the latest $T_2$ NMR measurements associated with the latest centrifuging operation. The previously determined cumulative pore volume includes a combined pore volume determined by all previous $T_2$ measurements that are performed following previously run centrifuge operations performed on a core sample saturated with $D_2O$.

Each NMR measurement is made after centrifuging. As mentioned earlier, for a given test, the centrifuge is normally operated at a constant rotational speed. Otherwise, where a rotational speed changes during centrifuging, information associated with the lower rotational speed is lost. Consequently, a pore size for a particular capillary pressure (which is associated with a particular rotational speed of the centrifuge) is obtained using low-field $^1H$ NMR $T_2$ measurements.

At step 108, a pore volume determined with the $T_2$ NMR is added to previously determined pore volumes associated with any previous centrifuging events with the core sample. The steps of centrifuging and performing $T_2$ NMR measurements may be repeated numerous times. For example, in a subsequent cycle, a rotational speed of the centrifuge may be increased and $T_2$ NMR measurements performed to determine a fracture pore volume associated with another secondary porosity. Alternatively, the rotational speed may remain constant while a different variable, such as temperature or confining pressure, is altered. Additional $T_2$ NMR measurements may then be made to determine the effect of the centrifuging change. This process may be repeated as many times as desired. Generally, for a particular experiment that involves a series of centrifuging runs for a core sample, a single, consistent experiment variable is changed for each cycle so that any resulting changes can be isolated from any other variable.

Figure 4:
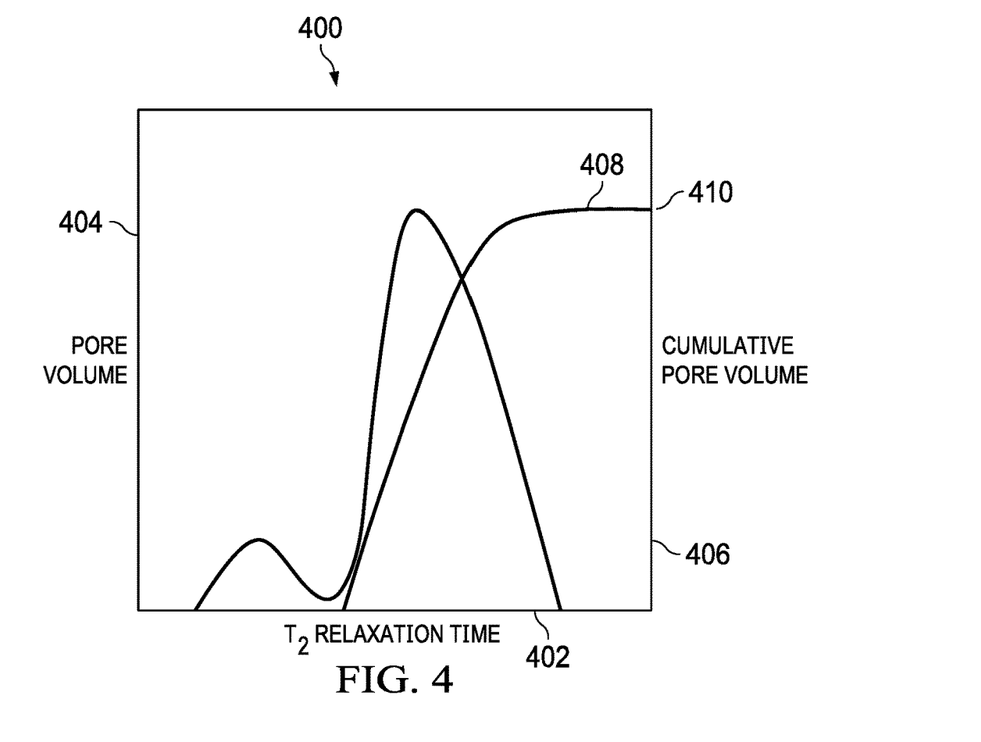
FIGS. 4-6 are example $T_2$ nuclear magnetic resonance (NMR) measurements from low-field $^1H$ NMR imaging, according to some implementations of the present disclosure.
Figure 5:
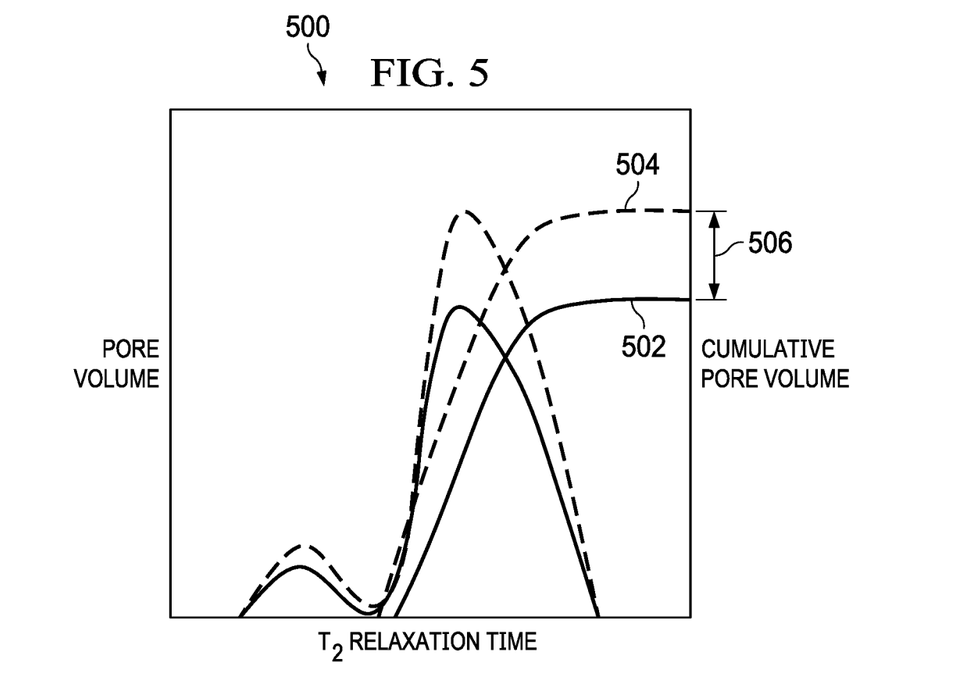
Figure 6:
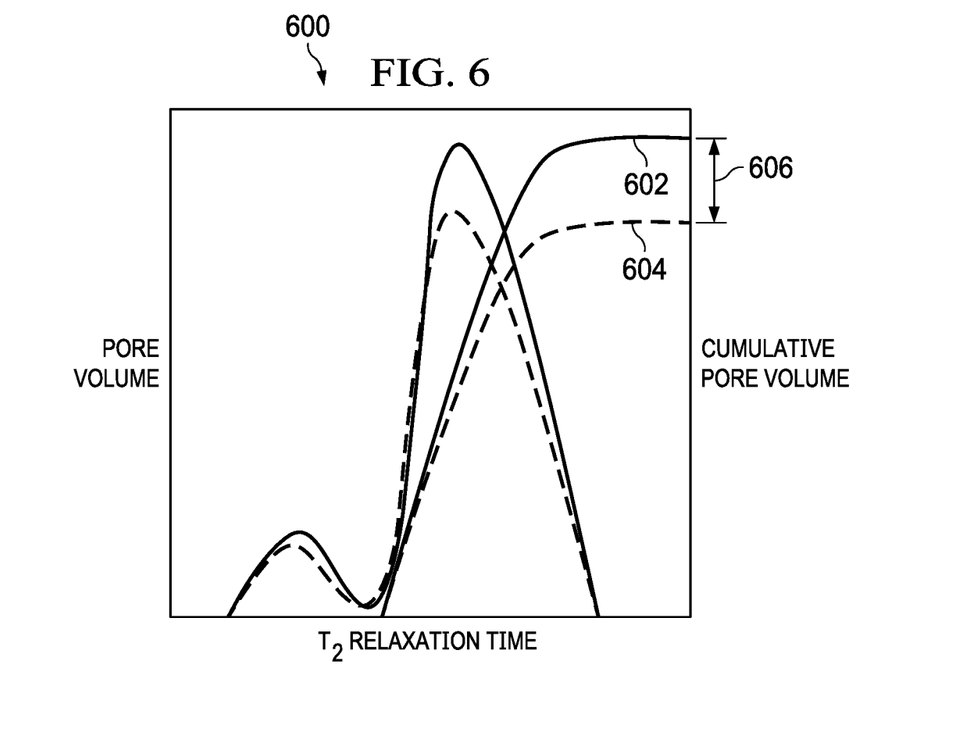

FIG. 4 is an example $T_2$ NMR measurement graph 400 of a core sample following a first centrifuge cycle. The x-axis represents the $T_2$ relaxation time, and the y-axis on the right-hand side of FIG. 4 represents cumulative pore volume. The first centrifuge cycle applied a first rotational speed and a first confining stress to the core sample. The x-axis 402 represents the $T_2$ relaxation time and the y-axis 404 on the right side of the graph 400 indicates pore volume, and the y-axis 406 on the left side of the graph 400 indicates total pore volume. The graph 400 includes a trace 408 that represents a vuggs pore volume measurement of the core sample following the first centrifuge cycle after saturation of the core sample with $D_2O$. The vuggs pore volume is indicated at 410 where the trace 408 intersects the y-axis 406. Because graph 400 represents the first centrifuge cycle, the pore volume and the cumulative pore volume are the same value. FIG. 5 is a second $T_2$ NMR measurement graph 500 that represents a second centrifuge cycle for the same core sample measured in FIG. 4. The x-axis and the y-axis shown in FIG. 5 are the same as that described earlier for FIG. 4. Here, a confining stress was increased at the same rotational speed as that applied in the test associated with the graph 400 of FIG. 4. Here, the graph 500 shows a first trace 502 (which is identical to the trace 408 of FIG. 4) and a second trace 504 (which represents the pore volume after the second centrifuge cycle). As indicated by the difference 506, an increase in the cumulative pore volume is indicated due to the increased confining stress and the same rotational speed as in the first centrifuge cycle. FIG. 6 is a graph 600 that represents a $T^2$ NMR measurement following an alternative second centrifuge cycle in which a rotational speed of the centrifuge was increased while the identical confining stress applied in the first centrifuge cycle was maintained. The x-axis and the y-axis shown in FIG. 6 are the same as that described earlier for FIGS. 4 and 5. A first trace 602 is identical to trace 408 of FIG. 4. A second trace 604 represents the $T_2$ NMR measurement taken after the alternative second centrifuge cycle. As shown, a difference 606 represents a decrease in the cumulative pore volume between the first centrifuge cycle and the alternative second centrifuge cycle caused by the increase in rotational speed and constant confining stress.

In some implementations, a baseline centrifuge test may be performed on a core sample. The baseline centrifuge test may involve a plurality of centrifuge cycles with $T_2$ NMR measurements taken between the centrifuge cycles. The baseline centrifuge test is applied to a core sample saturated with $D_2O$. Each centrifuge cycle may be performed at an increased rotational speed compared to a preceding centrifuge cycle without application of any confining stress. The baseline centrifuge test detects and measures pore volumes of different secondary porosities. Results of the baseline centrifuge test provide a basis of comparison to results obtained from subsequent tests performed under in situ conditions (such as confining stress and temperature).

Figure 7:
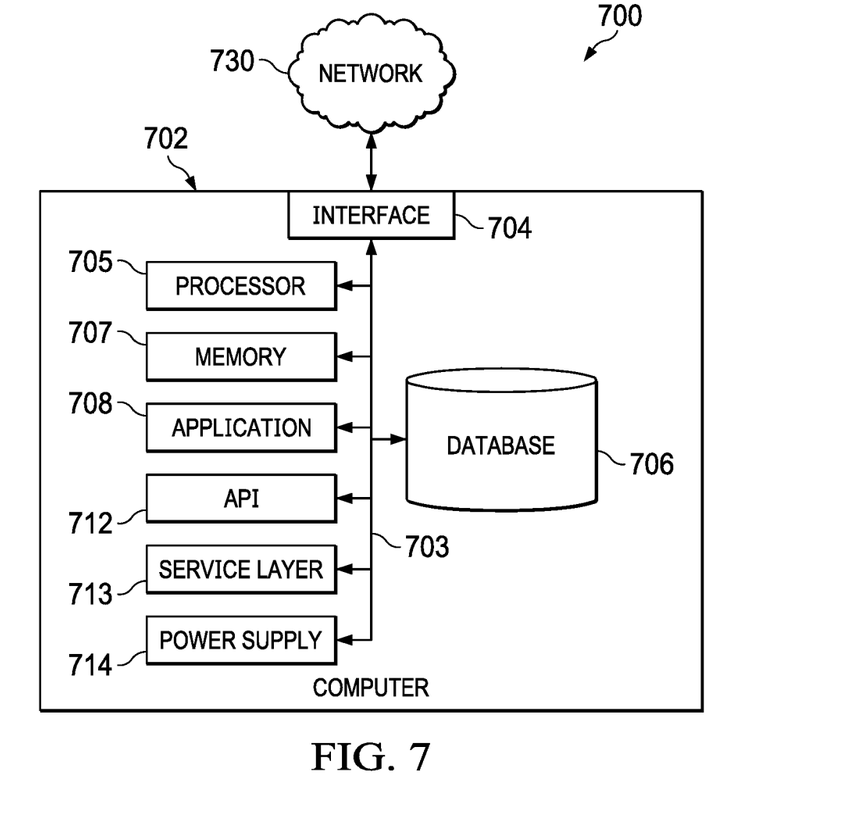
FIG. 7 is a block diagram illustrating an example computer system used to provide computational functionalities associated with described algorithms, methods, functions, processes, flows, and procedures as described in the present disclosure, according to some implementations of the present disclosure.

FIG. 7 is a block diagram of an example computer system 700 used to provide computational functionalities associated with described algorithms, methods, functions, processes, flows, and procedures described in the present disclosure, according to some implementations of the present disclosure. The illustrated computer 702 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 702 can include input devices such as keypads, keyboards, and touch screens that can accept user information. Also, the computer 702 can include output devices that can convey information associated with the operation of the computer 702. The information can include digital data, visual data, audio information, or a combination of information. The information can be presented in a graphical user interface (UI) (or GUI).

The computer 702 can serve in a role as a client, a network component, a server, a database, a persistency, or components of a computer system for performing the subject matter described in the present disclosure. The illustrated computer 702 is communicably coupled with a network 730. In some implementations, one or more components of the computer 702 can be configured to operate within different environments, including cloud-computing-based environments, local environments, global environments, and combinations of environments.

At a high level, the computer 702 is an electronic computing device operable to receive, transmit, process, store, and manage data and information associated with the described subject matter. According to some implementations, the computer 702 can also include, or be communicably coupled with, an application server, an email server, a web server, a caching server, a streaming data server, or a combination of servers.

The computer 702 can receive requests over network 730 from a client application (for example, executing on another computer 702). The computer 702 can respond to the received requests by processing the received requests using software applications. Requests can also be sent to the computer 702 from internal users (for example, from a command console), external (or third) parties, automated applications, entities, individuals, systems, and computers.

Each of the components of the computer 702 can communicate using a system bus 703. In some implementations, any or all of the components of the computer 702, including hardware or software components, can interface with each other or the interface 704 (or a combination of both), over the system bus 703. Interfaces can use an application programming interface (API) 712, a service layer 713, or a combination of the API 712 and service layer 713. The API 712 can include specifications for routines, data structures, and object classes. The API 712 can be either computer-language independent or dependent. The API 712 can refer to a complete interface, a single function, or a set of APIs.

The service layer 713 can provide software services to the computer 702 and other components (whether illustrated or not) that are communicably coupled to the computer 702. The functionality of the computer 702 can be accessible for all service consumers using this service layer. Software services, such as those provided by the service layer 713, can provide reusable, defined functionalities through a defined interface. For example, the interface can be software written in JAVA, C++, or a language providing data in extensible markup language (XML) format. While illustrated as an integrated component of the computer 702, in alternative implementations, the API 712 or the service layer 713 can be stand-alone components in relation to other components of the computer 702 and other components communicably coupled to the computer 702. Moreover, any or all parts of the API 712 or the service layer 713 can be implemented as child or sub-modules of another software module, enterprise application, or hardware module without departing from the scope of the present disclosure.

The computer 702 includes an interface 704. Although illustrated as a single interface 704 in FIG. 7, two or more interfaces 704 can be used according to particular needs, desires, or particular implementations of the computer 702 and the described functionality. The interface 704 can be used by the computer 702 for communicating with other systems that are connected to the network 730 (whether illustrated or not) in a distributed environment. Generally, the interface 704 can include, or be implemented using, logic encoded in software or hardware (or a combination of software and hardware) operable to communicate with the network 730. More specifically, the interface 704 can include software supporting one or more communication protocols associated with communications. As such, the network 730 or the interface's hardware can be operable to communicate physical signals within and outside of the illustrated computer 702.

The computer 702 includes a processor 705. Although illustrated as a single processor 705 in FIG. 7, two or more processors 705 can be used according to particular needs, desires, or particular implementations of the computer 702 and the described functionality. Generally, the processor 705 can execute instructions and can manipulate data to perform the operations of the computer 702, including operations using algorithms, methods, functions, processes, flows, and procedures as described in the present disclosure.

The computer 702 also includes a database 706 that can hold data for the computer 702 and other components connected to the network 730 (whether illustrated or not). For example, database 706 can be an in-memory, conventional, or a database storing data consistent with the present disclosure. In some implementations, database 706 can be a combination of two or more different database types (for example, hybrid in-memory and conventional databases) according to particular needs, desires, or particular implementations of the computer 702 and the described functionality. Although illustrated as a single database 706 in FIG. 7, two or more databases (of the same, different, or combination of types) can be used according to particular needs, desires, or particular implementations of the computer 702 and the described functionality. While database 706 is illustrated as an internal component of the computer 702, in alternative implementations, database 706 can be external to the computer 702.

The computer 702 also includes a memory 707 that can hold data for the computer 702 or a combination of components connected to the network 730 (whether illustrated or not). Memory 707 can store any data consistent with the present disclosure. In some implementations, memory 707 can be a combination of two or more different types of memory (for example, a combination of semiconductor and magnetic storage) according to particular needs, desires, or particular implementations of the computer 702 and the described functionality. Although illustrated as a single memory 707 in FIG. 7, two or more memories 707 (of the same, different, or combination of types) can be used according to particular needs, desires, or particular implementations of the computer 702 and the described functionality. While memory 707 is illustrated as an internal component of the computer 702, in alternative implementations, memory 707 can be external to the computer 702.

The application 708 can be an algorithmic software engine providing functionality according to particular needs, desires, or particular implementations of the computer 702 and the described functionality. For example, application 708 can serve as one or more components, modules, or applications. Further, although illustrated as a single application 708, the application 708 can be implemented as multiple applications 708 on the computer 702. In addition, although illustrated as internal to the computer 702, in alternative implementations, the application 708 can be external to the computer 702.

The computer 702 can also include a power supply 714. The power supply 714 can include a rechargeable or non-rechargeable battery that can be configured to be either user- or non-user-replaceable. In some implementations, the power supply 714 can include power-conversion and management circuits, including recharging, standby, and power management functionalities. In some implementations, the power-supply 714 can include a power plug to allow the computer 702 to be plugged into a wall socket or a power source to, for example, power the computer 702 or recharge a rechargeable battery.

There can be any number of computers 702 associated with, or external to, a computer system containing computer 702, with each computer 702 communicating over network 730. Further, the terms "client," "user," and other appropriate terminology can be used interchangeably, as appropriate, without departing from the scope of the present disclosure. Moreover, the present disclosure contemplates that many users can use one computer 702 and one user can use multiple computers 702.

Described implementations of the subject matter can include one or more features, alone or in combination.

For example, in a first implementation, a computer-implemented method, including: saturating a rock sample with deuterium oxide ($D_2O$); centrifuging the rock sample at a first selected rotational speed in the presence of a second fluid to displace a portion of the $D_2O$ in the rock sample with the second fluid; measuring the rock sample with low-field $^1$H nuclear magnetic resonance (NMR) to determine a first volume of the second fluid within the rock sample; and determining a pore volume associated with a secondary porosity based on the first volume of the second fluid within the rock sample.

The foregoing and other described implementations can each, optionally, include one or more of the following features:

A first feature, combinable with any of the following features, wherein saturating the rock sample with $D_2O$ includes saturating the rock sample with a solution containing $D_2O$.

A second feature, combinable with any of the previous or following features, wherein saturating the rock sample with $D_2O$ includes saturating the rock sample with a vacuum pump or pressure cell.

A third feature, combinable with any of the previous or following features, the method further including applying a selected confining stress to the rock sample while centrifuging the rock sample.

A fourth feature, combinable with any of the previous or following features, wherein the selected confining stress is an in situ confining stress of a reservoir from which the rock sample was obtained.

A fifth feature, combinable with any of the previous or following features, the method further including further applying a selected temperature to the rock sample while centrifuging the rock sample.

A sixth feature, combinable with any of the previous or following features, wherein the selected temperature is an in situ temperature of a reservoir from which the rock sample was obtained.

A seventh feature, combinable with any of the previous or following features, the method further including centrifuging the rock sample in the presence of the second fluid at a second selected rotational speed greater than the first selected rotational speed after the measuring the rock sample with low-field $^1$H NMR; measuring the rock sample with low-field $^1$H NMR following centrifuging of the rock sample at the second selected rotational speed to determine a second volume of the second fluid in the rock sample; and allocating a volume of $D_2O$ displaced from the rock sample by the second fluid during centrifuging the rock sample at the second selected rotational speed based on the first volume of the second fluid and second volume of the second fluid.

An eight feature, combinable with any of the previous or following features, wherein the pore volume associated with a secondary porosity includes a pore volume associated with a first secondary porosity, and wherein allocating a volume of $D_2O$ displaced from the rock sample by the second fluid during centrifuging the rock sample as the second selected rotational speed based on the first volume of the second fluid and second volume of the second fluid includes determining a pore volume associated with a second secondary porosity.

A ninth feature, combinable with any of the previous or following features, wherein allocating a volume of $D_2O$ displaced from the rock sample by the second fluid during centrifuging the rock sample as the second selected rotational speed includes determining a compressibility of the pore volume associated with the secondary porosity.

A tenth feature, combinable with any of the previous or following features, wherein the low-field $^1$H NMR is a $^1$H NMR $T_2$ measurement.

In a second implementation, a non-transitory, computer-readable medium storing one or more instructions executable by a computer system to perform operations including: saturating a rock sample with deuterium oxide ($D_2O$); centrifuging the rock sample at a first selected rotational speed in the presence of a second fluid to displace the $D_2O$ in the rock sample with the second fluid; measuring the rock sample with low-field $^1$H nuclear magnetic resonance (NMR) to determine a volume of the second fluid within the rock sample; and determining a pore volume associated with a secondary porosity based on the volume of the second fluid within the rock sample.

The foregoing and other described implementations can each, optionally, include one or more of the following features:

A first feature, combinable with any of the following features, wherein saturating a rock sample with $D_2O$ includes operating a vacuum pump or pressure cell to generate a pressure drop across the rock sample.

A second feature, combinable with any of the previous or following features, wherein centrifuging the rock sample at a first selected rotational speed in the presence of a second fluid to displace the $D_2O$ in the rock sample with the second fluid includes controlling a centrifuge to rotate the rock sample at the first selected rotational speed to displace a portion of the $D_2O$ with the second fluid.

A third feature, combinable with any of the previous or following features, wherein measuring the rock sample with low-field $^1$H NMR to determine a volume of the second fluid within the rock sample includes measuring the rock sample with a low-field $^1$H NMR $T_2$ measurement.

In a third implementation, a computer-implemented system, including one or more processors and a non-transitory computer-readable storage medium coupled to the one or more processors and storing programming instructions for execution by the one or more processors, the programming instructions instructing the one or more processors to perform operations including: saturate a rock sample with deuterium oxide ($D_2O$); centrifuge the rock sample at a first selected rotational speed in the presence of a second fluid to displace a portion of the $D_2O$ in the rock sample with the second fluid; measure the rock sample with low-field $^1$H nuclear magnetic resonance (NMR) to determine a volume of the second fluid within the rock sample; and determine a pore volume associated with a secondary porosity based on the volume of the second fluid within the rock sample.

The foregoing and other described implementations can each, optionally, include one or more of the following features:

A first feature, combinable with any of the following features, wherein the programming instructions operable to cause the one or more processors to saturate a rock sample with $D_2O$ include programming instructions operable to cause the one or more processors to operate a vacuum pump or a pressure cell to generate a pressure drop across the rock sample.

A second feature, combinable with any of the previous or following features, wherein the programming instructions operable to cause the one or more processor to centrifuge the rock sample at a first selected rotational speed includes computer program instructions operable to controlling a centrifuge to rotate the rock sample at the first selected rotational speed to displace a portion of the $D_2O$ with the second fluid.

A fourth feature, combinable with any of the previous or following features, the system further including programming instructions operable to cause the one or more processors to apply a confining pressure to the rock sample during centrifuging of the rock sample at the first rotational speed.

A fifth feature, combinable with any of the previous or following features, wherein the programming instructions operable to cause the one or more processors to measure the rock sample with low-field $^1$H NMR to determine the volume of the second fluid within the rock sample includes programming instructions operable to cause the one or more processors to measure the rock sample with a low-field $^1$H NMR $T_2$ measurement.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, program instructions can be encoded in/on an artificially generated propagated signal. The example, the signal can be a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatus, devices, and machines for processing data, including by way of example, a programmable processor, a computer, or multiple processors or computers. The apparatus can also include special purpose logic circuitry including, for example, a central processing unit (CPU), a field programmable gate array (FPGA), or an application specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example, LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer readable media (transitory or non-transitory, as appropriate) suitable for storing computer program instructions and data can include all forms of permanent/non-permanent and volatile/nonvolatile memory, media, and memory devices. Computer readable media can include, for example, semiconductor memory devices such as random access memory (RAM), read only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer readable media can also include, for example, magnetic devices such as tape, cartridges, cassettes, and internal/removable disks. Computer readable media can also include magneto optical disks and optical memory devices and technologies including, for example, digital video disc (DVD), CD ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated in, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that is used by the user. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

A number of implementations have been described. Nevertheless, it will be understood that various modifications may be made without departing from the spirit and scope of the present disclosure. For example, in some implementations, fractures may be artificially formed in a core sample using a triaxial cell. Accordingly, other embodiments are within the scope of the following claims.

What is claimed is:

1. A method for determining secondary porosities in a rock sample, the method comprising:
   saturating a rock sample with deuterium oxide ($D_2O$);
   centrifuging the rock sample at a first selected rotational speed in the presence of a second fluid to displace a portion of the $D_2O$ in the rock sample with the second fluid;
   measuring the rock sample with low-field $^1H$ nuclear magnetic resonance (NMR) to determine a first volume of the second fluid within the rock sample; and
   determining a pore volume associated with a secondary porosity based on the first volume of the second fluid within the rock sample.

2. The method of claim 1, wherein saturating the rock sample with $D_2O$ comprises saturating the rock sample with a solution containing $D_2O$.

3. The method of claim 1, wherein saturating the rock sample with $D_2O$ comprises saturating the rock sample with a vacuum pump or pressure cell.

4. The method of claim 1, further comprising applying a selected confining stress to the rock sample while centrifuging the rock sample.

5. The method of claim 4, wherein the selected confining stress is an in situ confining stress of a reservoir from which the rock sample was obtained.

6. The method of claim 1, further comprising applying a selected temperature to the rock sample while centrifuging the rock sample.

7. The method of claim 6, wherein the selected temperature is an in situ temperature of a reservoir from which the rock sample was obtained.

8. The method of claim 1, further comprising:
   centrifuging the rock sample in the presence of the second fluid at a second selected rotational speed greater than the first selected rotational speed after the measuring the rock sample with low-field $^1H$ NMR;
   measuring the rock sample with low-field $^1H$ NMR following centrifuging of the rock sample at the second selected rotational speed to determine a second volume of the second fluid in the rock sample; and
   allocating a volume of $D_2O$ displaced from the rock sample by the second fluid during centrifuging the rock sample at the second selected rotational speed based on the first volume of the second fluid and second volume of the second fluid.

9. The method of claim 8, wherein the pore volume associated with a secondary porosity comprises a pore volume associated with a first secondary porosity, and
   wherein allocating a volume of $D_2O$ displaced from the rock sample by the second fluid during centrifuging the rock sample as the second selected rotational speed based on the first volume of the second fluid and second volume of the second fluid comprises determining a pore volume associated with a second secondary porosity.

10. The method of claim 8, wherein allocating a volume of $D_2O$ displaced from the rock sample by the second fluid during centrifuging the rock sample as the second selected rotational speed comprises determining a compressibility of the pore volume associated with the secondary porosity.

11. The method of claim 1, wherein the low-field $^1H$ NMR is a $^1H$ NMR $T_2$ measurement.

* * * * *